(12) United States Patent
Miao (10) Patent No.: US 8,741,423 B2
(45) Date of Patent: *Jun. 3, 2014

(54) CARBON NANOTUBE PLATE AND APPLICATION THEREOF

(76) Inventor: Hsin Yuan Miao, Taichung (TW)

(*) Notice: Subject to any disclaimer, the term of this patent is extended or adjusted under 35 U.S.C. 154(b) by 451 days.

This patent is subject to a terminal disclaimer.

(21) Appl. No.: 13/094,551

(22) Filed: Apr. 26, 2011

(65) Prior Publication Data

US 2012/0273033 A1 Nov. 1, 2012

(51) Int. Cl.
*H01L 31/02* (2006.01)
*C25D 13/14* (2006.01)
*B32B 3/00* (2006.01)
*B82Y 99/00* (2011.01)
*B32B 9/00* (2006.01)

(52) U.S. Cl.
CPC .................................. *B32B 9/007* (2013.01)
USPC ...................................................... 428/195.1

(58) Field of Classification Search
USPC ...................................................... 428/195.1
See application file for complete search history.

(56) References Cited

U.S. PATENT DOCUMENTS

2009/0044848 A1 2/2009 Lashmore et al.
2012/0260961 A1* 10/2012 Miao .............................. 136/205

OTHER PUBLICATIONS

Berger, Michael, "Novel buckypaper device converts light into electricity", Nanowerk, 2010.

* cited by examiner

*Primary Examiner* — Mark Ruthkosky
*Assistant Examiner* — Ian Rummel
(74) *Attorney, Agent, or Firm* — Muncy, Geissler, Olds & Lowe, P.C.

(57) ABSTRACT

A carbon nanotube plate is provided. The plate includes a first carbon nanotube layer composed of many first carbon nanotubes and a second carbon nanotube layer disposed on the first carbon nanotube layer. The second carbon nanotube layer is composed of many second carbon nanotubes placed in an orderly manner on the first carbon nanotube layer. At least two second carbon nanotubes are located along a curve. The surface of the second carbon nanotube layer has a whirlpool pattern.

8 Claims, 6 Drawing Sheets

CARBON NANOTUBE PLATE AND APPLICATION THEREOF

BACKGROUND OF THE INVENTION

1. Field of the Invention

The present invention is related to a plate or sheet having a carbon nanotube (CNT) layer and applications thereof. In particular, the present invention relates to a novel buckypaper and applications thereof. The applications are related to a light-sensitive battery.

2. Description of the Related Art

A buckypaper is made of carbon nanotubes (CNTs) and is expressed as a "paper."

The weight of a volume of buckypaper materials is ten times less than that of the same volume of steel. However, a composition material made of stacked buckypaper materials provides stiffness five hundred times that of steel. In addition, a buckypaper provides good conductivity, comparable to copper or silicon, and also provides good heat-dissipating qualities, comparable to iron or brass.

A traditional method for manufacturing buckypaper is disclosed in U.S. Pat. No. 6,790,425. The disadvantage of this method is that the buckypaper has an asymmetric distribution of CNTs. Such a characteristic of a traditionally-made buckypaper limits the electromagnetic behavior and light-sensitivity of buckypaper.

Therefore, the present invention provides a novel buckypaper, and is used to eliminate the disadvantage of the traditional buckypaper.

BRIEF SUMMARY OF THE INVENTION

The present invention provides a carbon nanotube (CNT) plate. The CNT plate comprises a first carbon nanotube layer comprising a plurality of first carbon nanotubes, and a second carbon nanotube layer disposed on the first carbon nanotube layer. The second carbon nanotube layer comprises a plurality of second carbon nanotubes. The second carbon nanotubes are allocated in an orderly manner on the first carbon nanotube layer. At least two of the second carbon nanotubes are allocated along a first curve. The surface of the second carbon nanotube layer has a whirlpool pattern. Moreover, the first carbon nanotube layer has a first metal, and the second carbon nanotube layer has a second metal.

The present invention also provides a method for manufacturing a carbon nanotube plate. The method comprises providing a carbon nanotube plate, wherein the carbon nanotube plate is free of metals, and carrying out an electrophoresis method to implant metals into the carbon nanotube plate. The step of providing a carbon nanotube plate further comprises providing a carbon nanotube solution, wherein the carbon nanotube solution has a plurality of carbon nanotubes and a liquid, providing a substrate, wherein the substrate is non-conductive and the liquid can penetrate the substrate, covering the substrate with the carbon nanotube solution, letting the liquid of the carbon nanotube solution penetrate the substrate to form a carbon nanotube layer on the substrate, using an organic compound solution to remove the liquid from the carbon nanotube layer, using a cleaner to remove the organic compound solution from the carbon nanotube layer, and removing the cleaner from the carbon nanotube layer. During the step of letting the liquid of the carbon nanotube solution penetrate the substrate to form a carbon nanotube layer on the substrate, a whirlpool is created in the carbon nanotube solution.

The present invention further provides applications related to the carbon nanotube plate. One application is a light-sensitive battery comprising a first electrode, a second electrode, and a first carbon nanotube plate having a first end and a second end, wherein the first electrode connects the first end electrically, and the second electrode connects the second end electrically. The first carbon nanotube plate comprises a first carbon nanotube layer comprising a plurality of first carbon nanotubes and a second carbon nanotube layer disposed on the first carbon nanotube layer, wherein the second carbon nanotube layer comprises a plurality of second carbon nanotubes, the second carbon nanotubes are disposed in an orderly manner on the first carbon nanotube layer, at least two of the second carbon nanotubes are disposed along a first curve, and a surface of the second carbon nanotube layer has a first whirlpool pattern. Furthermore, the first and second carbon nanotube layers contain metals.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

1. CNT plate

Figure 1:
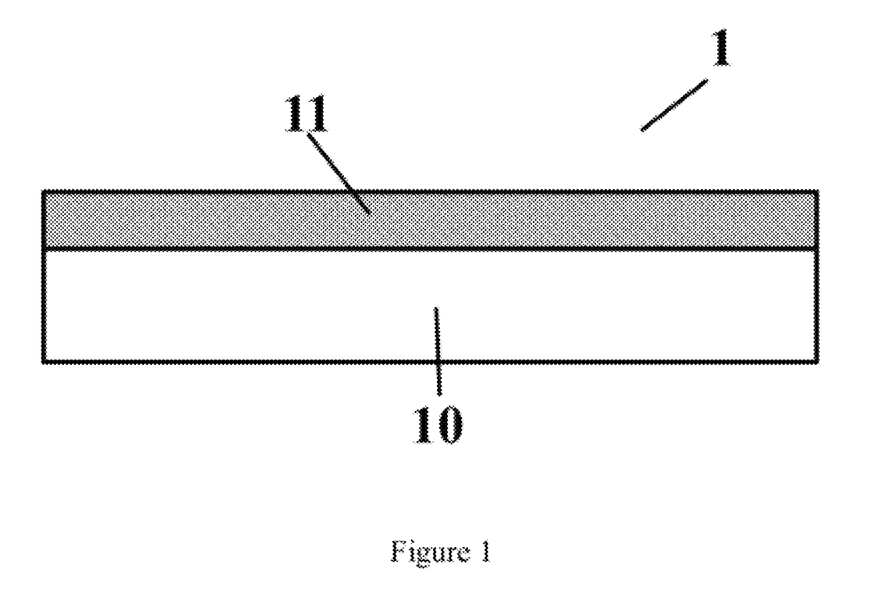
FIG. 1 shows a carbon nanotube plate in accordance with the present invention.

As shown in FIG. 1, the present invention provides a CNT plate 1. The CNT plate 1 may comprise a first CNT layer 10 and a second CNT layer 11. The first CNT layer 10 may comprise carbon nanotubes. The second CNT layer 11 may be disposed on the first CNT layer 10.

The shape of the first CNT layer 10 may be circular, rectangular, or of any other shape. The shape of the first CNT layer 10 may be similar to that of the second CNT layer 11.

Figure 2:
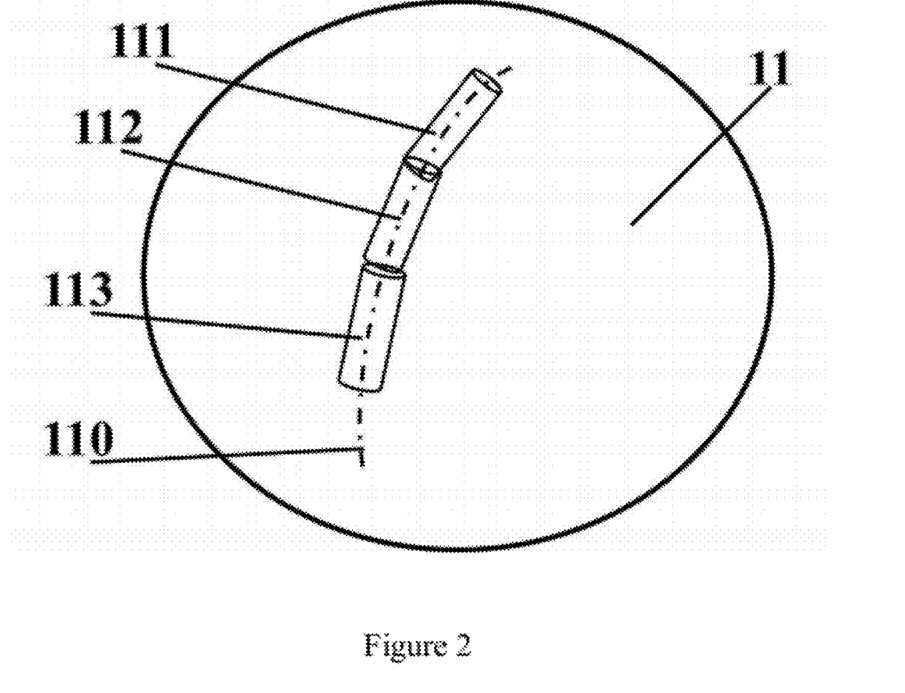
FIG. 2 shows a basic illustration of the distribution of carbon nanotubes.
Figures 3A, 3B:
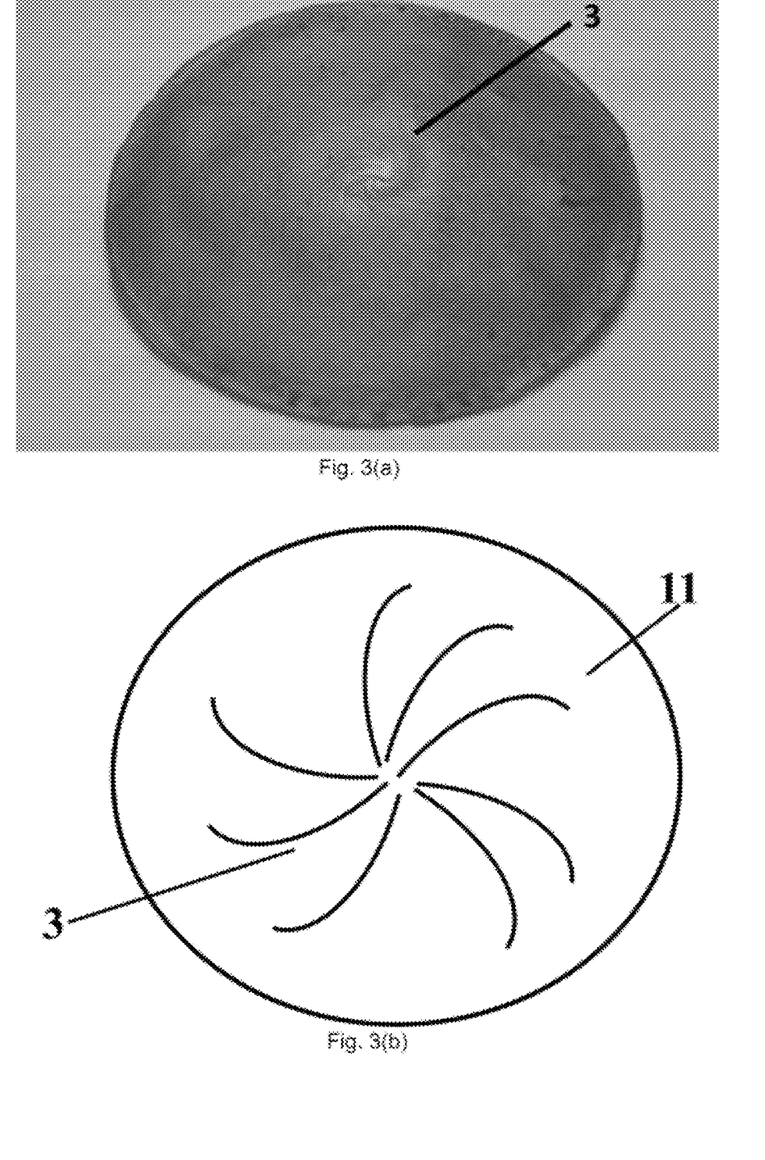
FIGS. 3(a) and 3(b) show the top view of one plate from one of the embodiments of the present invention.

The second CNT layer 11 comprises carbon nanotubes. As shown in FIG. 2, for instance, the carbon nanotubes 111, 112, 113 are located orderly on the first CNT layer 10. At least two of the carbon nanotubes 111, 112, 113 are allocated along a first curve 110 (shown as a dot-dash line). As shown in FIG. 3(b), there is a whirlpool pattern 3 on the surface of the second CNT layer 11. FIG. 3(a) shows a photo of the whirlpool pattern 3 on the CNT layer 11.

In some embodiments, in the CNT plate 1, the second CNT layer 11 contains metals or metal ions. The metal may be iron (Fe), titanium (Ti), or zinc (Zn).

In some embodiments, in the CNT plate 1, the first CNT layer 10 also contains metals or metal ions. The metal may be Fe, Ti, or Zn.

Figure 4:
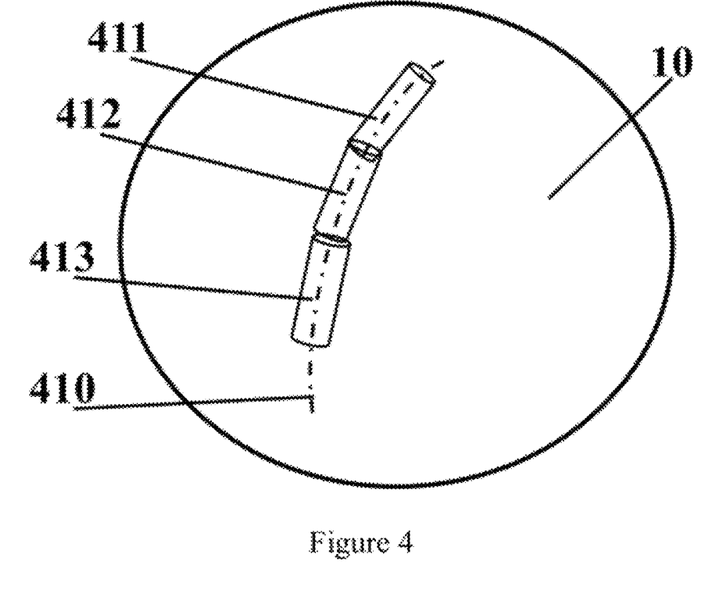
FIG. 4 shows a basic illustration of the distribution of carbon nanotubes.

As shown in FIG. 4, the structure of the first CNT layer 10 is similar to that of the second CNT layer 11. The first CNT layer 10 comprises carbon nanotubes. The carbon nanotubes 411, 412, 413 are located in an orderly manner on the first CNT layer 10. As shown in FIG. 4, at least two of the carbon nanotubes 411, 412, 413 are allocated along a second curve 410 (shown as a dot-dash line).

The statements about the CNT layers 10, 11 are for conceptually describing the idea related to a CNT plate 1 of the present invention. There might not be a distinctive boundary between the CNT layers 10, 11. Alternatively, there might be a recognizable boundary between CNT layers 10, 11. For description purposes, since the surface of the CNT plate 1 has a whirlpool pattern 3, the whirlpool pattern 3 might be claimed to be disposed on the second CNT layer 11 by using the second CNT layer 11 as one element of the CNT plate 1. In other words, "there is a whirlpool pattern 3 on the surface of the second CNT layer 11."

2. A Method for Manufacturing a CNT Plate

The present invention further provides a method for manufacturing a CNT plate 1. The method comprises providing a CNT solution, wherein the CNT solution comprises a liquid or a liquid-phase material. A substrate is provided. The substrate is covered with the CNT solution and the liquid of the CNT solution penetrates the substrate to form a CNT layer on the substrate. An organic compound solution is used to remove the liquid from the CNT layer, and a cleaner is used to remove the organic compound solution from the CNT layer. The cleaner is removed from the CNT layer. The CNT layer is referred to one embodiment of the CNT plate 1 of the present invention, and the CNT layer is not doped with metals. If a CNT layer doped with metals is desired, an electrophoresis method can be carried out to create a metal-doped CNT layer.

In the step of providing a CNT solution, the CNT solution comprises many carbon nanotubes and a liquid or a liquid-phase material. The liquid or liquid-phase material may include a surfactant and a solvent. The surfactant may be Triton X-100. The solvent may be water or another hydrophilic solution. The surfactant suspends the carbon nanotubes in the solvent.

In the step of providing a substrate, the substrate is nonconductive. The substrate may be composed of a paper or polymer material. The shape of the substrate may be circular, rectangular, or any other shape. In addition, the liquid of the CNT solution may penetrate the substrate. In other words, a large portion of the carbon nanotubes may remain on the substrate. The substrate may be a filter material that is capable of separating the carbon nanotubes from the liquid.

In the step of covering the substrate with the CNT solution, the method of the present invention further comprises providing a container, leaving the substrate on the bottom of the container, and pouring the CNT solution into the container.

In the step of letting the liquid penetrate the substrate, a CNT layer will be formed on the substrate. In this step, the method of the present invention further comprises making the atmospheric pressure above the substrate higher than the atmospheric pressure below the substrate. Because of the pressure difference, the speed at which the liquid penetrates will increase. In addition, in this step, the method of the present invention further comprises creating a whirlpool in the CNT solution. For example, a mixer can be used to create the whirlpool. The mixer has a flow impeller, and controlling the rotating speed of the flow impeller can change the pattern of the whirlpool.

In the step of using an organic compound solution to remove the liquid from the CNT layer, the organic compound solution may be a solution containing isopropanol.

In the step of using a cleaner to remove the organic compound solution from the CNT layer, the cleaner may be water.

In the step of removing the cleaner from the CNT layer, the method of the present invention further comprises heating the CNT layer and the substrate. In other words, by the mechanism of mass transfer, the cleaner will be removed from the CNT layer.

Lastly, the CNT layer is peeled from the substrate so as to get a CNT plate 1 of the present invention.

If it is necessary to prepare a CNT plate 1 containing metal ions or metals, metal ions can be doped into the peeled CNT layer. The method for doing so may be electrophoresis. In other words, one electrode and the peeled CNT layer are placed into a solution of metal ions. Then, by controlling the current flow between the electrode and the peeled CNT layer, the metal concentration of the CNT layer 10 or 11 of the CNT plate can be adjusted. That is, the metal ions penetrating into the CNT plate 1 may be concentrated in the second CNT layer 11 or may be distributed in both the CNT layer 10 and CNT layer 11.

More details of the embodiments of the present invention are illustrated as follows.

3. Preparation of Buckypapers without Metal Ions

The present invention further provides a method for making a buckypaper with no metals. First, a CNT solution is provided. The preparation of the CNT solution follows the steps:

(1) Add 0.03 g of carbon nanotubes having a length of 10 to 40 μm and 0.3 g Triton X-100 into a container having distilled water, so as to form a 0.25 liter CNT solution. The carbon nanotubes may be a multi-walled carbon nanotube (MWCNT), or a single-walled carbon nanotube (SWCNT).

(2) Place the container in an ultrasonic processor. Use ultrasonic power of 63 watts to disperse the carbon nanotubes. The process will take 5 minutes. In this step, the carbon nanotubes will not agglomerate in the solvent. It should be noted that an increase of ultrasonic power can improve the dispersion of carbon nanotubes but, to some extent, the carbon nanotubes will be broken by the ultrasonic power.

(3) Add distilled water into the container to increase the volume of the CNT solution to 0.5 liters. Next, continue the dispersion process with 63 watt ultrasonic power to disperse the carbon nanotubes for another 20 minutes. After this step, the carbon nanotubes will be more dispersed in the solvent.

(4) Divide the CNT solution of 0.5 liters into five cups, each cup having 0.1 liter of the CNT solution. For each cup, add distilled water to dilute the CNT solution and obtain a CNT solution of 0.4 liters. Next, place each cup in an ultrasonic processor and use ultrasonic power of 63 watts to disperse the carbon nanotubes in the cup. The ultrasonic process takes 30 minutes. After this step, the carbon nanotubes will be more dispersed in the solvent.

(5) Repeat steps (1) to (4) to obtain ten cups, each cup having a CNT solution of 0.4 liters.

After the preparation of a CNT solution, use a vacuum filter to separate the carbon nanotubes from the CNT solution, so that a CNT layer will be formed in the filter paper.

The vacuum filter comprises a porcelain filter and a filtrate container. The porcelain filter is combined with the filtrate container through an elastic tube. The porcelain filter has a tube that is inserted into the filtrate container. The filtrate will flow into the filtrate container through the tube. The filtrate container has a gas-out tube through which the gas in the filtrate container can be sucked from the filtrate container.

Place one filter paper on the porcelain filter. The step of providing a substrate will then be complete.

Pour the 0.4 liter CNT solution mentioned above into the porcelain filter. Then cover the filter paper with the CNT solution. The step of covering the substrate with the CNT solution is now complete.

Next, a vacuum filtration is carried out. Use a pump to remove the gas from inside the filtrate container. The air will start to leave the filtrate container through the gas-out tube. As a result, the carbon nanotubes in the CNT solution will gradually be deposited on the filter paper during the vacuum filtration. In the meantime, create a whirlpool in the CNT solution contained in the porcelain filter. For example, use a mixer to create a whirlpool. This will complete the step of letting the liquid of the CNT solution penetrate the substrate to form a CNT layer.

Pour all ten cups of a CNT solution of 0.4 liters, one by one, into the porcelain filter so as to operate a vacuum filtration. The process will take 10 to 12 hours. A buckypaper can be obtained, and the diameter of the buckypaper is about 4.2 micrometers.

Next, submerge the buckypaper into a solution containing isopropanol. The submerging process will take more than three hours so as to remove the surfactant Triton X-100 from the buckypaper. This will complete the step of using an organic compound solution to remove the liquid from the CNT layer.

Next, remove the buckypaper from the isopropanol solution. Place the buckypaper in moving water to remove isopropanol from the buckypaper. This will complete the step of using a cleaner to remove the organic compound solution from the CNT layer.

Lastly, dry the buckypaper in a baker. The temperature of the baker is 120° Celsius. This step will take 30 minutes. The step of removing the cleaner from the CNT layer will then be done.

Now, the buckypaper is still attached to the filter paper. Once the buckypaper is peeled off from the filter paper, one piece of buckypaper of the present invention will be completed, as shown in FIG. 3(a).

4. Preparation of Buckypapers Containing Metal Ions

The present invention further provides a method for preparing buckypapers containing metal ions.

First, pick up one buckypaper made by the previously-mentioned method, where the buckypaper has no metals. Then, carry out electrophoresis to implant metals or metal ions into the buckypaper. Lastly, bake the buckypaper so as to complete a buckypaper doped with metal ions or metals.

The present invention further provides the following details regarding how to carry out the electrophoresis. The description is as follows:

(1) Prepare an electrophoresis solution that may be a ferric nitrate solution, titanium nitrate solution, or zinc nitrate.

(2) Set the graphite electrode as a positive electrode and the buckypaper as a negative electrode, and place the graphite electrode and buckypaper into the electrophoresis solution.

(3) Begin the electrophoresis where the operating parameters include the metal ion concentration and current flow.

In the step of baking the buckypaper, first put the buckypaper that has undergone electrophoresis into the baker. The baker contains oxygen. The baking process requires 200 degrees Celsius. This process takes about three hours.

In some embodiments, there are two sets of operating parameters for electrophoresis. The first set (Group I) includes 0.01 M for the electrophoresis solution, 0.01 mA for the current flow, and 10 seconds for the electrophoresis time. The second set (Group II) includes 0.1 M for the electrophoresis solution, 1 mA for the current flow, and 300 seconds for the electrophoresis time. The samples made through the former operating parameter set are called a lowly metal-doped buckypaper. The samples made via the latter operating parameter set are called a highly metal-doped buckypaper.

5. Light-Sensitive Battery

Figure 5A:
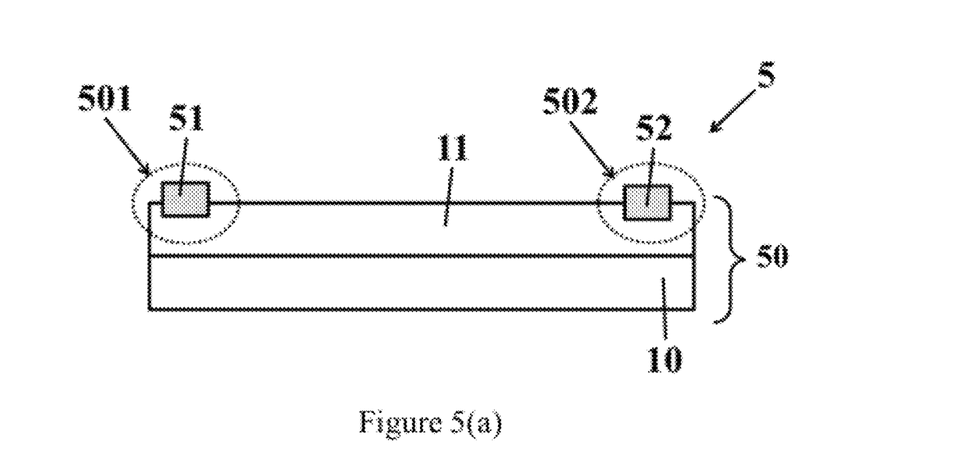
FIG. 5 shows one light-sensitive battery of the present invention.

As shown in FIG. 5, the present invention further provides an application for the CNT plate 1 mentioned above. The application is a light-sensitive battery 5 that comprises a first electrode 51, a second electrode 52 and a first CNT plate 50. The first CNT plate 50 comprises a first end 501 and a second end 502. The first electrode 51 electrically connects the first end 501, and the second electrode 52 electrically connects the second end 502. In addition, regarding the structure of the first CNT plate 50, please refer to the descriptions related to FIGS. 1 to 4.

Figure 5B:
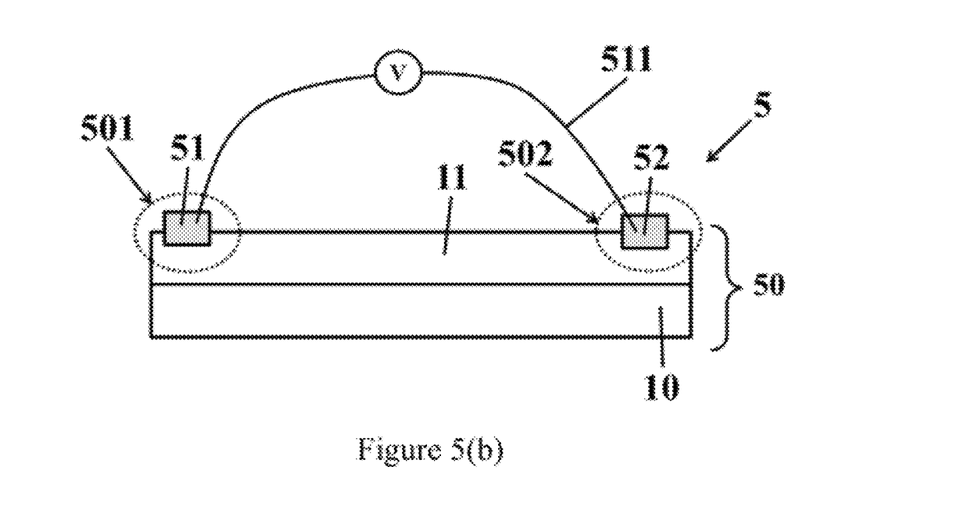

It should be noted that FIG. 5(b) shows a wire 511 connecting the first electrode 51 and the second electrode 52. However, the wire 511 is not a necessary part of the light-sensitive battery of the present invention. Also, the carbon nanotubes used in the battery of the present invention may be MWCNTs or SWCNTs. The first CNT plate 50 may be a lowly metal-doped buckypaper or a highly metal-doped buckypaper. The metal may be Fe, Ti or Zn.

Figure 6:
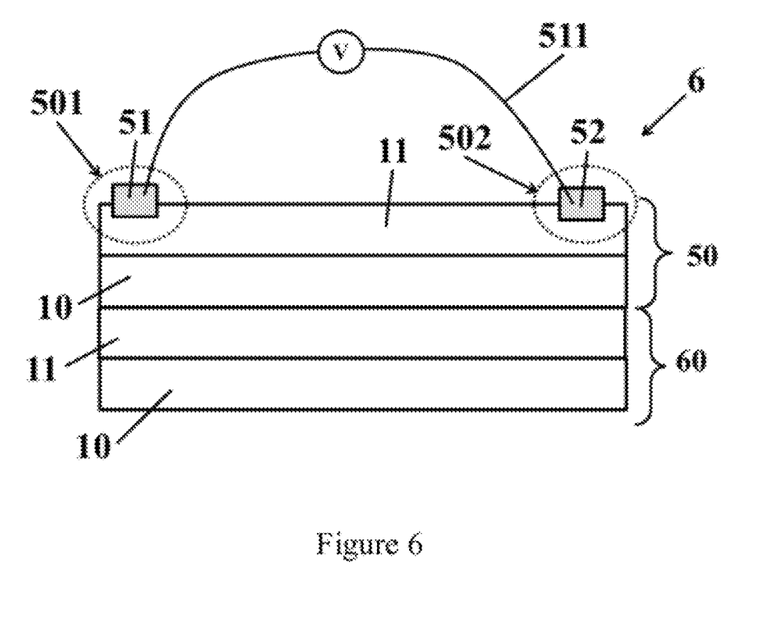
FIG. 6 shows one light-sensitive battery of the present invention.

The present invention further provides a light-sensitive battery 6 comprising two CNT plates 50, 60, as shown in FIG. 6. The CNT plate 50 is disposed on the CNT plate 60. Each element in FIG. 6 can be described in accordance with its counterpart in FIG. 5 and relevant descriptions thereof. The first CNT plate 60 may be a lowly metal-doped buckypaper or a highly metal-doped buckypaper. The metal may be Fe, Ti or Zn.

When light reaches the surface of a CNT plate 50, light energy will be transformed into electrical energy. The electrons stored in the CNT plates 50, 60 become movable, so that when two electrodes are electrically connected, a light-sensitive battery is formed.

6. Verification of a Light-Sensitive Battery

The verification of a light-sensitive battery is illustrated as follows. An LED light is used as a light source. The light sources, wave lengths and model numbers are shown in Table 1:

TABLE 1

| Light Source | Wave Length (nm) | Model Number |
| --- | --- | --- |
| Infrared Light | 940 | L-53F3BT |
| Red Light | 700 | LED-5SHR |
| Orange Light | 625-630 | LED-513ED |
| Yellow Light | 585 | YC-513-YT |
| Green Light | 568 | YC-513-GT |
| Blue Light | 470 | LED-513UBC |
| Ultraviolet Light (UV) | 405 | LED-513UV |

Use the above-mentioned method to make several kinds of buckypaper. The metal components, CNT components, operating parameters for electrophoresis and label numbers of the buckypapers made are listed in Table 2:

TABLE 2

| Sample Number | Metal | CNT | Operating Parameters for Electrophoresis | Label Number |
|---|---|---|---|---|
| 1 | Fe | SWCNT | Group I | Fe-SWCNT |
| 2 | Ti | SWCNT | Group I | Ti-SWCNT |
| 3 | Zn | SWCNT | Group I | Zn-SWCNT |
| 4 | Fe | MWCNT | Group I | Fe-MWCNT |
| 5 | Ti | MWCNT | Group I | Ti-MWCNT |
| 6 | Zn | MWCNT | Group I | Zn-MWCNT |
| 7 | Fe | SWCNT | Group II | H—Fe-SWCNT |
| 8 | Ti | SWCNT | Group II | H—Ti-SWCNT |
| 9 | Zn | SWCNT | Group II | H—Zn-SWCNT |
| 10 | Fe | MWCNT | Group II | H—Fe-MWCNT |
| 11 | Ti | MWCNT | Group II | H—Ti-MWCNT |
| 12 | Zn | MWCNT | Group II | H—Zn-MWCNT |

The verification of a light-sensitive battery of the present invention was done for a single-CNT-layered, light-sensitive battery as shown in FIG. 5. The verification of a light-sensitive battery of the present invention was also done for a double-CNT-layered, light-sensitive battery as shown in FIG. 6.

The verification started by cutting a CNT plate sample into a 2.5 cm×0.5 cm rectangular shape. Two electrodes 51, 52 were electrically connected to a High Voltage Source Meter (made by Keithley Co. with a model number Keithley 2410) through a wire 511 made of copper. Silver gel was used to affix the wire 511 to the corresponding contacts on the buckypaper 50 so as to make the wire 511 closely contact the buckypaper 50. Lastly, carbon conductive tapes were used to affix the sample onto a glass carrier.

To acquire a fixed amount of light exposure, the light was projected to a 2.5 cm×0.5 cm area (of the carbon nanotube layer 50). In addition, a black paper was used to cover the non-exposed portion of the layer 50.

When a testing of light sensitivity was carried out, the sample was placed under an atmosphere of a normal pressure or 10 mTorr.

Infrared light was used as a light source to conduct a testing of light sensitivity for single-CNT-layered, light-sensitive batteries. For buckypaper samples used by the present invention, when exposed to the light source, the resistance of such samples will drop. In other words, when the buckypaper sample is exposed to the light source, the electron mobility of the sample will be increased. This phenomenon happens at both a normal pressure and 10 mTorr pressure.

Light sources were then used to conduct a testing of light sensitivity for double-CNT-layered, light-sensitive batteries. The double CNT layers 50, 60 include a Zn-MWCNT buckypaper and a Ti-SWCNT buckypaper. Please refer to FIG. 6. The CNT plate 60 is a Ti-SWCNT buckypaper, while the CNT plate 50 is a Zn-MWCNT buckypaper. Infrared light was used as a light source, wherein the Ti-SWCNT buckypaper was exposed to such an infrared light. The voltage drop between the two electrodes 51, 52 disposed on the Zn-MWCNT buckypaper was about 20 μV. When yellow light was used, the voltage drop was about 10 μV. When green light was used, the voltage drop was about 20 to 40 μV. When blue light was used, the voltage drop was about 0.4 mV. When UV light was used, the voltage drop was about 20 μV. Conclusively, under light exposure, the voltage drop means that light energy has been transformed into electricity stored in the light-sensitive battery of the present invention.

Therefore, the light-sensitive battery 5, or 6, of the present invention can transform LED light into electrical energy so as to provide electricity.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A carbon nanotube plate, comprising:
   a first carbon nanotube layer comprising a plurality of first carbon nanotubes; and
   a second carbon nanotube layer disposed on the first carbon nanotube layer;
      Wherein the second carbon nanotube layer comprises a plurality of second carbon nanotubes; the second carbon nanotubes are allocated in an orderly manner on the first carbon nanotube layer; at least two of the second carbon nanotubes are allocated along a first curve; a surface of the second carbon nanotube layer has a whirlpool pattern; the first carbon nanotube layer has a first metal; and the second carbon nanotube layer has a second metal.

2. A carbon nanotube plate as claimed in claim 1, wherein the first carbon nanotubes and second carbon nanotubes are multi-walled carbon nanotubes.

3. A carbon nanotube plate as claimed in claim 1, wherein the first carbon nanotubes and second carbon nanotubes are single-walled carbon nanotubes.

4. A carbon nanotube plate as claimed in claim 1, wherein the first carbon nanotube layer and second carbon nanotube layer are composed of a plurality of multi-walled carbon nanotubes or a plurality of single-walled carbon nanotubes.

5. A light-sensitive battery, comprising:
   a first electrode;
   a second electrode; and
   a first carbon nanotube plate having a first end and a second end, wherein the first electrode connects the first end electrically, and the second electrode connects the second end electrically;
   wherein the first carbon nanotube plate comprises:
      a first carbon nanotube layer comprising a plurality of first carbon nanotubes; and
      a second carbon nanotube layer disposed on the first carbon nanotube layer;
         wherein the second carbon nanotube layer comprises a plurality of second carbon nanotubes; wherein the second carbon nanotubes are disposed in an orderly manner on the first carbon nanotube layer; wherein at least two of the second carbon nanotubes are disposed along a first curve; wherein a surface of the second carbon nanotube layer has a first whirlpool pattern; wherein the first carbon nanotube layer and second carbon nanotube layer contain a first metal.

6. A light-sensitive battery as claimed in claim 5, wherein the first metal is Fe, Ti or Zn.

7. A light-sensitive battery as claimed in claim 5, wherein the first carbon nanotube layer and second carbon nanotube layer are composed of a plurality of multi-walled carbon nanotubes or a plurality of single-walled carbon nanotubes.

8. A light-sensitive battery as claimed in claim 5, further comprising a second carbon nanotube plate disposed on one side of the first carbon nanotube plate;
   wherein the second carbon nanotube plate comprises:
      a third carbon nanotube layer comprising a plurality of third carbon nanotubes; and a fourth carbon nanotube layer disposed on the third carbon nanotube layer;
wherein the fourth carbon nanotube layer comprises a plurality of fourth carbon nanotubes; wherein the fourth carbon nanotubes are disposed in an orderly manner on the third carbon nanotube layer; wherein at least two of the fourth carbon nanotubes are disposed along a third curve; wherein a surface of the third carbon nanotube layer has a second whirlpool pattern; wherein the third carbon nanotube layer and fourth carbon nanotube layer contain a second metal.

* * * * *